(12) United States Patent
Ge et al.

(10) Patent No.: US 10,319,441 B2
(45) Date of Patent: Jun. 11, 2019

(54) NONVOLATILE MEMORY CROSS-BAR ARRAY

(71) Applicant: HEWLETT PACKARD ENTERPRISE DEVELOPMENT LP, Houston, TX (US)

(72) Inventors: Ning Ge, Palo Alto, CA (US); Jianhua Yang, Palo Alto, CA (US); John Paul Strachan, San Carlos, CA (US); Miao Hu, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 16/220,647

(22) Filed: Dec. 14, 2018

(65) Prior Publication Data

US 2019/0139605 A1    May 9, 2019

Related U.S. Application Data

(63) Continuation of application No. 15/535,765, filed as application No. PCT/US2014/070266 on Dec. 15, 2014, now Pat. No. 10,181,349.

(51) Int. Cl.
*G11C 13/04* (2006.01)
*G11C 13/00* (2006.01)
*G06G 7/16* (2006.01)

(52) U.S. Cl.
CPC ........... *G11C 13/0069* (2013.01); *G06G 7/16* (2013.01); *G11C 13/004* (2013.01); *G11C 13/0007* (2013.01); *G11C 2213/79* (2013.01)

(58) Field of Classification Search
CPC ............ G11C 13/0069; G11C 13/0004; G11C 13/0007
USPC ........................................................ 365/148
See application file for complete search history.

(56) References Cited

U.S. PATENT DOCUMENTS

| 8,825,730 | B1 | 9/2014 | Perry et al. |
| 2012/0014170 | A1 | 1/2012 | Strukov et al. |
| 2013/0028004 | A1 | 1/2013 | Snider |
| 2013/0223132 | A1 | 8/2013 | Perner |
| 2014/0061568 | A1 | 3/2014 | Ramaswamy et al. |

(Continued)

OTHER PUBLICATIONS

Extended European Search Report, EP Application No. 14908534.2, dated Nov. 7, 2017, pp. 1-9, EPO.

(Continued)

*Primary Examiner* — Jason Lappas
(74) *Attorney, Agent, or Firm* — Hewlett Packard Enterprise Patent Department

(57) ABSTRACT

Provided in one example is a nonvolatile memory cross-bar array. The array includes: a number of junctions formed by a number of row lines intersecting a number of column lines; a first set of controls at a first set of the junctions coupling between a first set of the row lines and a first set of the column lines; a second set of controls at a second set of the junctions coupling between a second set of the row lines and a second set of the column lines; and a current collection line to collect currents from the controls of the first set and the second set through their respective column lines and output a result current corresponding to a sum of a first dot product and a second dot product.

12 Claims, 4 Drawing Sheets

(56) References Cited

U.S. PATENT DOCUMENTS

| | | |
|---|---|---|
| 2014/0172937 A1* | 6/2014 | Linderman .............. G06G 7/16 |
| | | 708/607 |
| 2014/0181483 A1 | 6/2014 | O'Connor et al. |
| 2014/0204651 A1 | 7/2014 | Perner |
| 2014/0286077 A1 | 9/2014 | Hatsuda |

OTHER PUBLICATIONS

International Search Report and Written Opinion, International Application No. PCT/US2014/070266, dated Aug. 21, 2015, pp. 1-9, KIPO.

Ligang Gao et al., "Analog-input Analog-weight Dot-product Operation with Ag/a-Si/Pt Memristive Devices," Jul. 17, 2012, pp. 1-6, University of California Santa Barbara, Santa Barhara CA USA.

\* cited by examiner

NONVOLATILE MEMORY CROSS-BAR ARRAY

CROSS-REFERENCE TO RELATED APPLICATIONS

This application is a continuation of U.S. patent application Ser. No. 15/535,765, filed Jun. 14, 2017, now U.S. Pat. No. 10,181,349, the entire content of which is hereby incorporated by reference as though fully set forth herein.

BACKGROUND

Resistive memory elements often referred to as memristors are devices that may be programmed to different resistive states by applying electrical voltage or currents to the memristors. After programming the state of the memristors, the memristors may be read. The state of the memristors remains stable over a specified time period long enough to regard the device as nonvolatile. A number of memristors may be included within a cross-bar array in which a number of column lines intersect with a number of row lines at junctions, and the memristors are coupled to the column lines and row lines at the junctions.

BRIEF DESCRIPTION OF THE DRAWINGS

The drawings are provided to illustrate various examples of the subject matter described herein in this disclosure (hereinafter "herein" for short, unless explicitly stated otherwise) related to a nonvolatile memory cross-bar array and are not intended to limit the scope of the subject matter. The drawings are not necessarily to scale.

DETAILED DESCRIPTION

Figure 1:
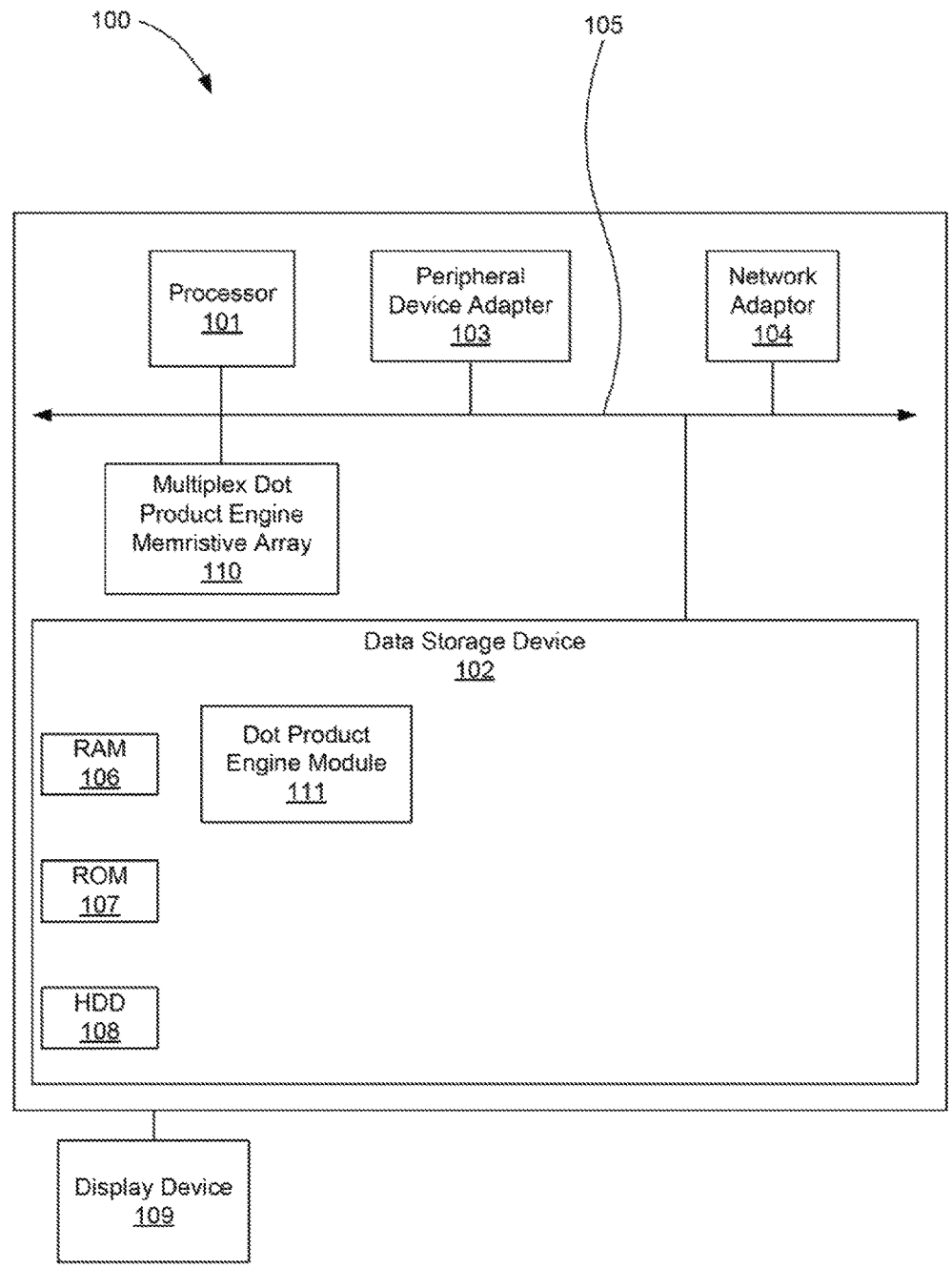
FIG. 1 is a schematic diagram showing one example of a system to perform operations involved in dot product calculations as described herein.

Following below are more detailed descriptions of various examples related to a cross-bar array, particularly a nonvolatile memory cross-bar array, for determining a sum of multiple dot products. The various examples described herein may be implemented in any of numerous ways.

Provided in one aspect of the examples is a nonvolatile memory cross-bar array, including: a number of junctions formed by a number of row lines intersecting a number of column lines; a first set of controls at a first set of the junctions coupling between a first set of the row lines and a first set of the column lines, each control of the first set including a first transistor and a first resistive memory element; a second set of controls at a second set of the junctions coupling between a second set of the row lines and a second set of the column lines, each control of the second set including a second transistor and a second resistive memory element, wherein each column line includes a junction of the first set and a junction of the second set in two different row lines; and a current collection line to collect currents from the controls of the first set and the second set through their respective column lines and output a result current corresponding to a sum of a first dot product and a second dot product corresponding respectively to currents collected from the controls of the first set and the second set.

Provided in another aspect of the examples is a system, including: a processor; and a nonvolatile memory cross-bar array coupled to the processor, the memristor cross-bar array including: a number of junctions formed by a number of row lines intersecting a number of column lines; a first set of controls at a first set of the junctions coupling between a first set of the row lines and a first set of the column lines, each control of the first set including a first transistor and a first resistive memory element; and a second set of controls at a second set of the junctions coupling between a second set of the row lines and a second set of the column lines, each control of the second set including a second transistor and a second resistive memory element, wherein each column line includes a junction of the first set and a junction of the second set in two different row lines; wherein the first set of controls and the second set of controls are independently to: receive a number of programming signals at the respective controls, the programming signals defining a number of matrix values; and receive a number of vector signals at the respective controls, the vector signals defining a number of vector values to be applied to the respective controls; and wherein a sum of a first dot product and a second dot product is calculated using currents collected from respectively the controls of the first set and the second set, corresponding to the respective matrix values and vector values.

Provided in another aspect of the examples is a method of calculating, including: applying a first set of voltages to a first set of row lines within a nonvolatile memory cross-bar array to change resistive values of a corresponding first set of controls located at a first set of junctions between the first set of row lines and a first set of column lines, the first set of voltages defining a corresponding number of values within a first matrix, and each control of the first set including a first transistor and a first resistive memory element; applying a second set of voltages to a second set of row lines within the nonvolatile memory cross-bar array to change resistive values of a corresponding second set of controls located at a second set of junctions between the second set of row lines and a second set of column lines, the second voltages defining a corresponding number of values within a second matrix, and each control of the second set including a second transistor and a second resistive memory element, wherein each column line includes a junction of the first set and a junction of the second set in two different row lines; applying a third set and a fourth set of voltages respectively to the row lines of the first set and second set, the voltages of the third set and fourth set defining a corresponding number of vector values applied to the first matrix and the second matrix, respectively; collecting currents through the respective column lines of the controls of the first set and the second set corresponding to the respective matrix values and vector values of the first and second matrices; and calculating a sum of a first dot product and a second dot product using the currents collected respectively from the controls of the first set and the second set, corresponding to the respective matrix values and vector values.

Resistive Random-Access Memory

The term "memristance" herein may refer to the phenomenon that when charge flows in one direction through a circuit, the resistance of that component of the circuit will increase; and when charge flows in the opposite direction in the circuit, the resistance will decrease. When the flow of charge is stopped by turning off the applied voltage, the component will "remember" the last resistance that it had, and when the flow of charge starts again the resistance of the circuit will be what it was when it was last active. In one example, a resistance memory element is a resistor device whose resistance may be changed.

The term "resistive memory element" herein may refer to a programmable nonvolatile memory where the switching mechanism involves ionic motion, including valance change memory, electrochemical metallization memory, and others. Resistive memory elements may be employed in a variety of applications, including nonvolatile solid state memory, programmable logic, signal processing, control systems, pattern recognition, and other applications. One example of a resistive memory element is a resistive random-access memory ("ReRAM"). A ReRAM works by changing the electrical resistance across a dielectric solid-state material that may include a memristor. Examples of ReRAM include a memristor, a phase-change memory, a conductive-bridging RAM, and a spin-transfer torque RAM. Merely to facilitate the explanation and for the sake of convenience, a memristor is employed herein to describe a ReRAM; however, it is appreciated that the description may be applicable to other types of ReRAM.

Memristive devices, such as ReRAM, such as memristors, are devices that may be used as a component in a wide range of electronic circuits, such as memories, switches, and logic circuits and systems. The conductance channels in the ReRAMs may be formed in each ReRAM, and each ReRAM may be individually addressed as bits. The ReRAM may be built at the micro- or nano-scale. When used as a basis for memories, the ReRAM may be employed to store a bit of information, 1 or 0. When used as a logic circuit, the ReRAM may be employed to represent bits in a field programmable gate array, as a basis for a wired-logic programmable logic array, or, as described herein, as a dot product engine ("DPE"). The ReRAM may be fabricated through any reasonably suitable fabrication process, such as, for example, chemical vapor deposition, sputtering, etching, lithography, or other methods of forming memristors.

In a memory structure, a nonvolatile memory cross-bar array of ReRAMs (e.g., memristors), such as a memristive cross-bar array ("MCA") for short herein, may be employed. In one example, a cross-bar array is an array of switches that connect each wire in one set of parallel wires to every member of a second set of parallel wires that intersects the first set—e.g., row lines intersecting column lines. For example, when employed as a basis for memories, a ReRAM may be employed to store bits of information, in the form of 1 or 0, corresponding to whether the memristor is in its high or low resistance state (or vice versa). When employed as a logic circuit, a ReRAM may be employed as configuration bits and switch in a logic circuit similar to a Field Programmable Gate Array, or may be the basis for a wired-logic Programmable Logic Array. It is also possible to employ ReRAMs capable of multistate or analog behavior for these and other applications.

When employed as a switch, the ReRAM, of which memristor is one example, may either be in a low resistance (closed) state or high resistance (open) state in a cross-point memory. The resistance of a ReRAM may be changed by applying an electrical stimulus, such as a voltage or a current, through the ReRAM. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON."

Nonvolatile Memory Cross-Bar Array

Nonvolatile memory cross-bar arrays (of ReRAM, of which memristor is one example) may be employed in a variety of applications, including nonvolatile solid state memory, programmable logic, signal processing, control systems, pattern recognition, and other applications. The nonvolatile memory cross-bar array may be employed to perform calculations related to dot products. Each dot product may include a number of input matrix values and a number of input vector values. In one example, the nonvolatile memory cross-bar array herein is employed to calculate the sum of multiple dot products. The calculations, including the summation thereof, of the dot products may be performed simultaneously using the nonvolatile memory cross-bar array described herein without using a storage element. The term "dot product" herein may refer to the product of two vectors to form a scalar, whose value is the product of the magnitudes of the vectors and the cosine of the angle between them. The vectors may be represented as matrices that may be multiplied to obtain the dot product. Other conventional names for dot product include "scalar product" and "inner product."

The nonvolatile memory cross-bar array (or "array" for short) described herein may include a number of suitable components. The term "a number of" or similar language herein may refer to any positive number from 1 to infinity. The array may include a number of row lines and a number of column lines intersecting the row lines to form a number of junctions. The array may include a first set of controls at a first set of the junctions coupling between a first set of the row lines and a first set of the column lines, and a second set of controls at a second set of the junctions coupling between a second set of the row lines and a second set of the column lines. The term "coupling" herein may refer to electrical coupling. It is noted that the terms "first," "second," "third," etc. herein are only meant to connote that the objects they respectively describe are separate entities, and are not meant to connote any chronological order unless explicitly stated otherwise. The different controls may be arranged in the array in any suitable way, depending on the application. In one example, each column line includes a junction of the first set and a junction of the second set in two different row lines. The different row lines may be adjacent to each other or not adjacent to each other.

Each control of the first set may include a first transistor and a first resistive memory element. Each control of the second set may include a second transistor and a second resistive memory element. The transistor may be placed in series with the resistive memory element in the control. The transistors of the different controls may be the same or different from each other. The transistor herein may be any suitable semiconductor device capable of being used to amplify and/or switch electronic signals and/or electrical power. For example, the transistor may be a complementary metal-oxide semiconductor ("CMOS") field effect transistor ("FET"), which may operate as a switch. In one example, the transistor is an n-type MOSFET including a gate, channel, n-source/drain doped with a p-well, etc. The transistor may operate in a depletion mode. In one example, the transistor On resistance ("Ron") contributes to the parasitic resistance, but not variable resistance change of the resistive memory element.

The resistive memory element herein may be any type of ReRAM, such as a memristor. The resistive memory element of the different controls may be the same or different from each other. In one example, the resistive memory elements of the different sets are different from each other (with respect to the different sets). The difference may be with respect to the materials, design, properties, etc. of the elements. In one example, the different resistive memory elements of the different sets have different preset conductance values from one another.

The array described herein may also include a current collection line to collect currents from the column lines. In one example, the current collection line collects currents from the controls of the different sets (e.g., first, second, etc.) through their respective column lines and output a result current. The currents collected from the multiple sets of the controls may correspond to multiple dot products. In one example, the collected currents from each set of controls equals a dot product of the matrix values and vector values. In one example, the result current corresponds to a sum of multiple dot products, each corresponding to the currents collected from the respective controls of the multiple sets. In one example, the current collection line is further employed to output the result current corresponding to the sum of the first dot product and the second dot product. While voltages and currents are described herein as being collected at the ends of column lines and further collected using the collection line, any circuit topology or design may be employed to obtain a desired output such as a voltage value, a current value or other circuit parameter.

The controls of the different sets in the array described herein may perform their respective operations/instructions independently (with respect to the different sets). For example, all controls in the first set may perform a certain set of operations, and they do so independently from the controls in the second set, which perform a different set of instructions. The operations may involve any suitable operations, depending on the application. For example, the operations may include executing calculations of a dot product. Each control, including the resistive memory element thereof, may receive a number of programming signals. The programming signals may define a number of values within a matrix. Each control, including the resistive memory element thereof, may also receive a number of vector signals at the control, particularly the resistive memory element. The vector signals may represent a number of vector values to be applied to the control, particularly the resistive memory element.

FIG. 1 provides a schematic diagram of a system (100) in one example. The system may be a computing system. The system (100) may be implemented in an electronic device. Examples of electronic devices include servers, desktop computers, laptop computers, personal digital assistants (PDAs), mobile devices, smartphones, gaming systems, and tablets, among other electronic devices.

The system (100) may be employed in any data processing scenario including, stand-alone hardware, mobile applications, etc., through a computing network. Further, the system (100) may be employed in a computing network, a public cloud network, a private cloud network, a hybrid cloud network, other forms of networks, or combinations thereof. In one example, the methods provided by the system (100) are provided as a service over a network by, for example, a third party. In this example, the service may include, for example, the following: a Software as a Service ("SaaS") hosting a number of applications; a Platform as a Service ("PaaS") hosting a computing platform including, for example, operating systems, hardware, and storage, among others; an Infrastructure as a Service ("IaaS") hosting equipment such as, for example, servers, storage components, network, and components, among others; application program interface ("API") as a service ("APIaaS"), other forms of network services, or combinations thereof. The present systems may be implemented on one or multiple hardware platforms, in which the modules in the system may be executed on one or across multiple platforms. Such modules may run on various forms of cloud technologies and hybrid cloud technologies or offered as a "SaaS" (Software as a service) that may be implemented on or off the cloud. In another example, the methods provided by the system (100) are executed by a local administrator.

To achieve its desired operation, the system (100) may include various hardware components. Examples of these hardware components may include a number of processors (101), a number of data storage devices (102), a number of peripheral device adapters (103), and a number of network adapters (104). These hardware components may be interconnected through the use of a number of busses and/or network connections. In one example, any combination of the processor (101), data storage device (102), peripheral device adapters (103), the multiplex Dot Product Engine nonvolatile memory array (110) and a network adapter (104) may be communicatively coupled using a bus (105).

The data storage device (102) may store data such as machine-readable instructions (e.g., computer code) that may be executed by the processor (101) or other processing device. For example, the data storage device (102) may specifically store machine-readable instructions for a number of applications that the processor (101) may execute to implement at least the operation described herein.

The data storage device (102) may include various types of memory modules, including volatile and nonvolatile memories. For example, the data storage device (102) may include Random Access Memory ("RAM") (106), Read Only Memory ("ROM") (107), and Hard Disk Drive ("HDD") memory (108). Other suitable types of memory may also be employed. In one example, different types of memory in the data storage device (102) are used for different data storage needs. For example, the processor (101) may boot from Read Only Memory ("ROM") (107), maintain nonvolatile storage in the Hard Disk Drive ("HDD") memory (108), and execute machine-readable instructions stored in Random Access Memory ("RAM") (106).

The data storage device (102) may include a machine-readable medium, such as a computer readable storage medium, a non-transitory computer readable medium, etc. For example, the data storage device (102) may be an electronic, magnetic, optical, electromagnetic, infrared, or semiconductor system, apparatus, or device, or any suitable combination of the foregoing. Some examples of the computer readable storage medium include the following: an electrical connection having a number of wires, a portable computer diskette, a hard disk, a random access memory (RAM), a read-only memory ("ROM"), an erasable programmable read-only memory ("EPROM" or Flash memory), a portable compact disc read-only memory ("CD-ROM"), an optical storage device, a magnetic storage device, or any suitable combination thereof. A computer readable storage medium herein may refer to any non-transitory, tangible medium that may contain, or store, machine-readable instructions (e.g., computer usable program code) for use by or in connection with an instruction execution system, apparatus, or device.

The hardware adapters, including a peripheral device adapter (103) and a network adaptor (104), in the system (100) may facilitate the processor (101) to interface with various other hardware elements, external and internal to the system (100). For example, the peripheral device adapter (103) may provide an interface to input/output devices, such as, for example, display device (109), a mouse, or a keyboard. The peripheral device adapter (103) may also provide access to other external devices, such as an external storage device, a number of network devices such as, for example, servers, switches, and routers, client devices, other types of computing devices, and combinations thereof.

The display device (109) may be provided to allow a user of the system (100) to interact with and implement the operation of the system (100). The peripheral device adapter (103) may also create an interface between the processor (101) and the display device (109), a printer, or other media output devices. The network adapter (104) may provide an interface to other computing devices within, for example, a network, thereby facilitating the transmission of data between the system (100) and other devices located within the network.

The system (100) may, when executed by the processor (101), display the number of graphical user interfaces ("GUIs") on the display device (109) associated with the executable machine-readable instructions (e.g., program code) representing the number of applications stored on the data storage device (102). The GUIs may display, for example, interactive screenshots that allow a user to interact with the system (100) to input matrix and vector values in association with a multiplex dot product engine ("DPE") nonvolatile memory array (110), as described in more detail below. Additionally, via making a number of interactive gestures on the GUIs of the display device (109), a user may obtain a value from dot product calculations based on the input data. Examples of display devices (109) include a computer screen, a laptop screen, a mobile device screen, a personal digital assistant ("PDA") screen, and a tablet screen, among other display devices.

The system (100) may include a multiplex mode dot product engine ("DPE") nonvolatile memory array (110). This array may be electrically coupled to the processor. As will be described in more detail below, the multiplex mode DPE nonvolatile memory array (110) may include a number of elements including a number of ReRAM (e.g., memristors) that operate together within the array to perform a weighted sum of multiple inputs. The multiplex mode DPE nonvolatile memory array (110) may be employed in any suitable application. For example, the multiplex mode DPE nonvolatile memory array (110) may be used as a threshold logic gate ("TLG") to perform a matrix product to compare the output with a threshold. The output may be, for example, a sum of multiple dot products—thus the term "multiplex mode" DPE herein. The multiplex mode DPE nonvolatile memory array (110) may be employed as an accelerator in which the multiplex mode DPE nonvolatile memory array (110) performs a number of functions faster than is possible in software running on a more general-purpose processing device. Although the multiplex mode DPE nonvolatile memory array (110) is depicted as being a device internal to the system (100) in this example, the multiplex mode DPE nonvolatile memory array (110) may be a peripheral device coupled to the system (100) or included within a peripheral device coupled to the system (100).

The system (100) may include a number of modules employed in the implementation of the systems and methods described herein. The various modules within the system (100) include machine-readable instructions, such as an executable program code, that may be executed separately. The various modules may be stored as separate computer program products. The various modules within the system (100) may also be combined within a number of computer program products; each computer program product including a number of the modules.

The system (100) may include a dot product engine module (111), when executed by the processor (101), to participate in the operation of the multiplex mode DPE nonvolatile memory array (110). The dot product engine module (111), for example, may receive a number of input values defining a matrix to be processed in a dot product mathematical calculation. The dot product engine module (111) may send the input values to the multiplex mode DPE nonvolatile memory array (110) as programming signals to a number of controls, including the resistive memory elements therein, within the multiplex mode DPE nonvolatile memory array (110) to program any of the resistive memory elements, the transistors, or the controls as a whole. The dot product engine module (111) may also receive a vector input to be processed in connection with the matrix programmed into the controls. The dot product engine module (111) may further obtain a value representing the dot product or the sum of multiple dot products, and convey that value as data to the system (100) or another computing device for analysis or further processing.

Figure 2:
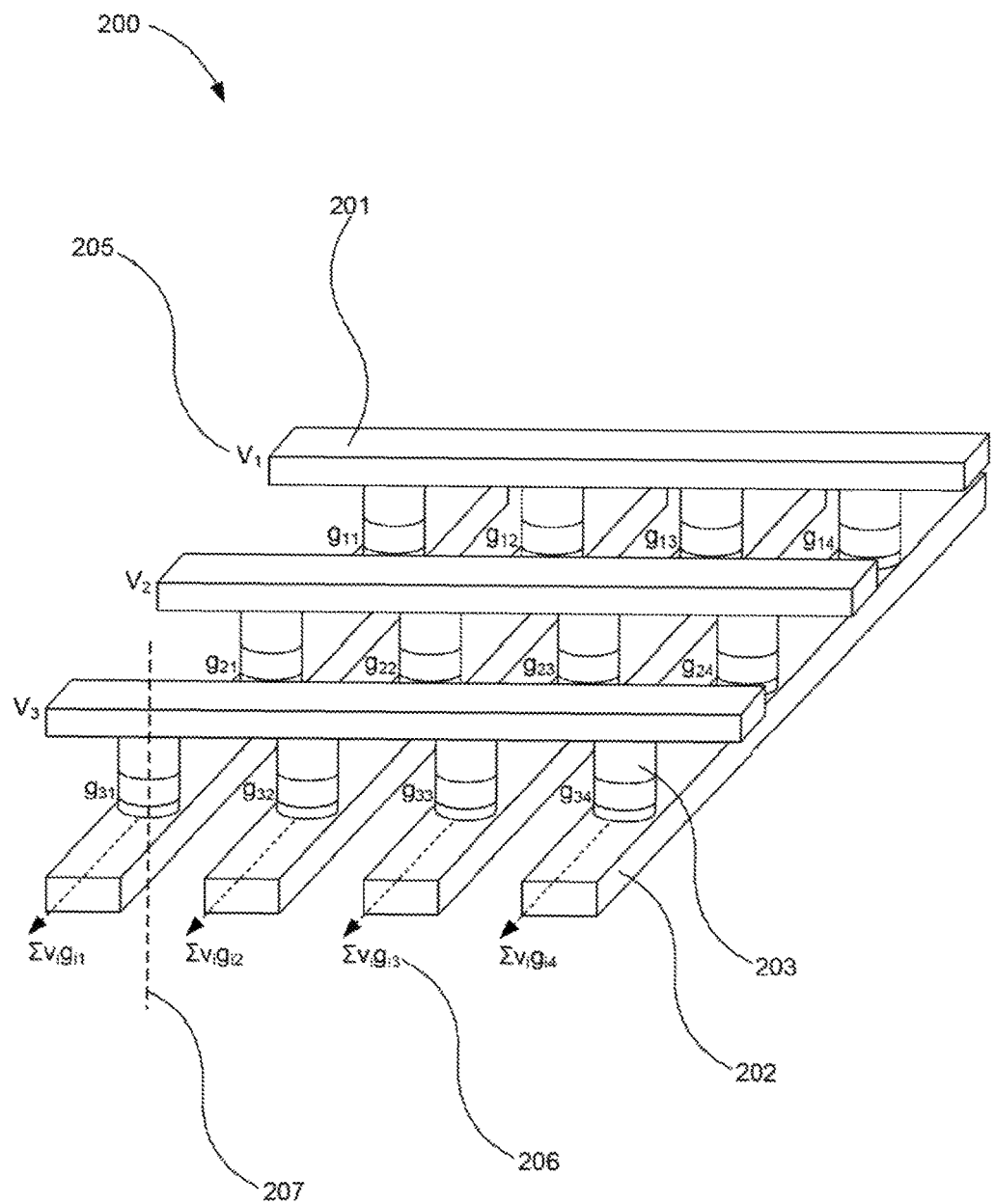
FIG. 2 is a schematic diagram showing one example of a nonvolatile memory cross-bar array employed in one example of a multiplex mode dot product engine ("DPE") nonvolatile memory array as described herein.

FIG. 2 is a schematic diagram showing one example of a nonvolatile memory cross-bar array (200), such as one used within the multiplex mode dot product engine ("DPE") nonvolatile memory array (110) of the system (100) of FIG. 1. The nonvolatile memory cross-bar array (200) may include a number of electrically conductive row lines (201) and a number of electrically conductive column lines (202). Even though three row lines (201) and four column lines (202) are depicted in FIG. 2, any number of row lines (201) and column lines (202) may be present in the nonvolatile memory cross-bar array (200) described herein. The row lines (201) and column lines (202) intersect at junctions as indicated by the dashed line (207). It is noted that in FIG. 2, the row lines (201) and the column lines (202) are shown as being perpendicular with respect to each other, but the row lines (201) and the column lines (202) may intersect at any angle. A number of controls (203) may be located at the junctions (207) and electrically couple the row lines (201) to the column lines (202). The control (203) herein may include any suitable number of components, as described below. For example, the control may include a transistor and a resistive memory element. The resistive memory element may be a ReRAM, such as a memristor.

The nonvolatile memory cross-bar array (200) of FIG. 2 may further include a number of input values (205) indicated as $V_1$, $V_2$, and $V_3$. The input values (205) may be program signals used to change the resistance values at the resistive memory element of each individual control (203) at each junction in the cross-bar array to create a representation (e.g., a mapping) of a mathematic matrix in which each value at each junction represents a value within the matrix. This change in resistance among the resistive memristive elements of the controls (203) may be an analog change from a low-to-high value or a high-to-low value. In one example, the resistive memory elements are "memory resistors" in that they "remember" the last resistance that they had—e.g., ReRAM.

The input values (205) may also be read signals used to read the resistance values at each individual resistive memory element of the controls (203) at each junction in the cross-bar array, and as a way to multiply a matrix value by a vector value at each control involved in the calculation.

The read signals herein referred to as a vector signals may be applied as second input values (205) to the row lines (201) of the nonvolatile memory cross-bar array (200). The vector signals may represent a vector to be multiplied to the matrix represented by the program signals. In one example, the vector signals have a lower voltage value than the first voltages used to program the controls (203), such that the voltage level applied by the vector signals does not change the resistance values of the controls (203) as programmed by the first voltages. In this example, the vector signals act as read signals in this manner by not changing the resistance values of the resistive memory elements in the controls (203).

The vector signals interact with the resistive memory elements in the controls (203) at their respective junctions (207), and the resulting current is collected at the end of each column line (202) at (206). The sum of each column line (202) is represented by $\Sigma v_i g_{i1}$, $\Sigma v_i g_{i2}$, $\Sigma v_i g_{i3}$, and $\Sigma v_i g_{i4}$ as indicated in FIG. 2 where $g_{i1-4}$ are the electrical conductance ("conductance" herein for short) values of the resistive memory elements. It is noted that conductance is the inverse of resistance.

The sums obtained from the voltage values represent the values of a column vector, or a subset of the column vector. These sums of each column line (202) may also be summed at a current collection line (311) through a conversion circuit (313) to obtain a single value of $$\sum_{i=1}^{m}$$

Iout$_i$ depicted in FIG. 3 and will be described in more detail below. Depending on the configuration, the single value of $$\sum_{i=1}^{m}$$

Iout$_i$ may present a sum of multiple dot products, each as a result obtained from the signals from different sets of controls. In one example, an initial signal is applied to a control, or a set of control, before application of the program signals and the vector signals in order to set the resistance of the control, particularly the resistive memory element thereof, to a known, preset, value.

Dot Product Engine ("DPE")

In general, the array may be represented by a single matrix in a DPE application, and each dot product calculation needs a new input vector. In a math form, this may be represented by $$V_{out} = \Sigma(V_{in\_x} \cdot M_1),\qquad (\text{Eq. 1})$$

where $V_{in\_x}$ is the input voltage set x, $M_1$ is the array with preset analog electrical resistance in multi-levels. When summation of multiple results (e.g., dot product calculations) is to be calculated; the following equation is employed:

$$V_{out} = \Sigma(V_{in\_x} \cdot M_1) + \Sigma(V_{in\_y} \cdot M_2),\qquad (\text{Eq. 2})$$

where $V_{in\_x}$ and $V_{in\_y}$ are different input voltages and $M_1$ and $M_2$ are two different sets of array corresponding to x and y. A pre-existing approach is to use one array multiple times then to store the values from each time into a memory, whereby the summation is performed by adding the values stored in memory. The multiplex dot product engine described herein, as reflected by the configuration of the nonvolatile memory cross-bar array described herein, is suitable to perform the summation of multiple matrices efficiently. For example, the summation performed by the array described herein may be performed in one single array without having to store the results into a memory for subsequent summation calculations. In one example, the multiplex dot product engine performs summation of multiple dot products simultaneously with the calculations of the dot products without storing the intermediate values in a storage unit (e.g., storing memory circuit). This may take the form of a hardware system not having a storing memory circuit, or not using the storing memory circuit in a hardware system even if one is present.

Figure 3:
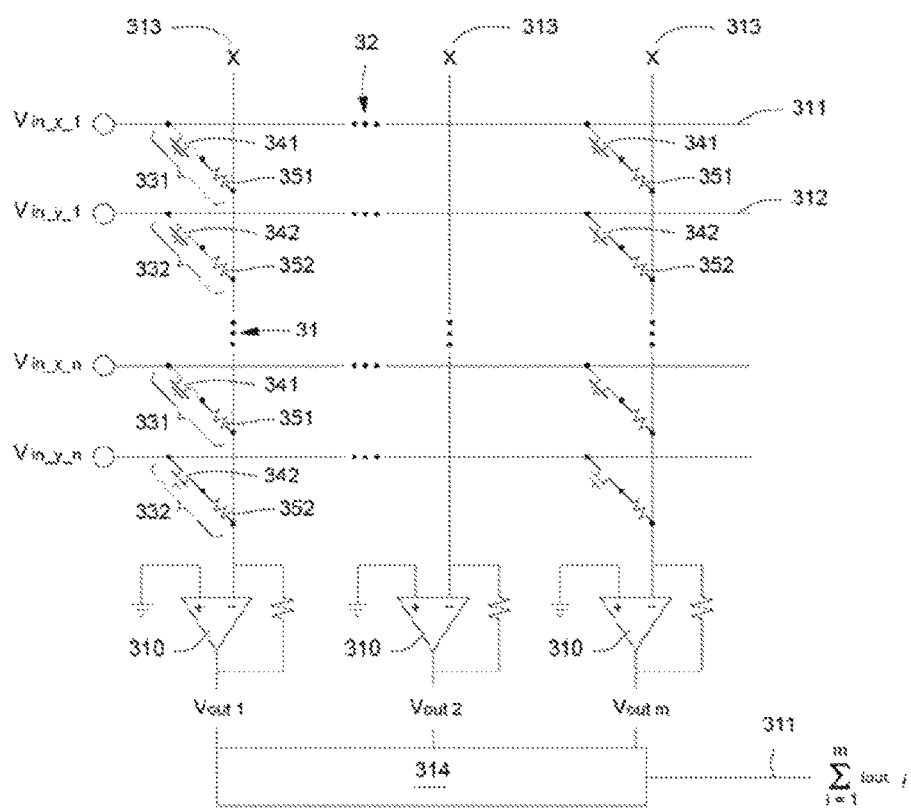
FIG. 3 is a schematic circuit diagram showing one example of the multiplex mode DPE nonvolatile memory array as described herein.

FIG. 3 is a schematic circuit diagram of one example of a multiplex mode DPE nonvolatile memory array, such as the array (110) shown in FIGS. 1 and 2. It is noted that although the multiplex mode DPE nonvolatile memory array (110) of FIG. 3 is depicted as having a circuit layout as depicted, any number of circuit layouts may be used to achieve the functions the systems and methods described herein. The multiplex mode DPE nonvolatile memory array (110) as depicted in FIG. 3 includes the row lines (311, 312), the column lines (313), and the controls (331) such as those corresponding features shown in FIG. 2. As mentioned above, any number of row lines and column lines may be included within the multiplex mode DPE nonvolatile memory array as indicated by the ellipses (31, 32). In one example, the number of row lines and column lines included within the multiplex mode DPE nonvolatile memory array may be equal to or greater than the size of the matrix of the dot product to be calculated using the systems and methods described herein.

As shown in FIG. 3, the array has two sets of sub-matrices (X & Y), with the set X denoted by the subscript "x" and set Y denoted by the subscript "y." It is noted that while two sets of sub-matrices are shown in FIG. 3, more than two sets are possible. Each set of the matrices, as reflected in the controls (331, 332), is associated with inputs based on a one-transistor-one-resistor ("1T1R") circuit architecture. As described above, the resistors of the first and second sets of controls, respectively, may be a resistive memory element, such as ReRAM. Each sub-matrix is controlled by a set of control signal. In this example, by turning on two control signals, the summation operation of the two dot products may be performed. In the case of more than two sets of sub-matrices, a corresponding number of controls signals are employed for the summation operation. In one example where a single matrix dot product is to be calculate, only one of the X and Y sets is turned on.

In the configuration as shown in FIG. 3, the array may include a first set of controls (331) at a first set of the junctions coupling between a first set of the row lines (311) (or those denoted with the subscript "x") and a first set of the column lines, and a second set of controls (332) at a second set of the junctions coupling between a second set of the row lines (312) (or those denoted with the subscript "y") and a second set of the column lines. In one example each column line includes a junction of the first set and a junction of the second set in two different row lines, as shown in FIG. 3; in other words, the first set of column lines are the same as the second set of column lines in this example. Each of the first set of controls has a transistor 341 and a resistive memory element 351, and each of the second set of controls has a transistor 342 and a resistive memory element 352. Input voltages in pairs for the two sets (Vin_x_1, Vin_y_1, Vin_x_2, Vin_y_2, . . . Vin_x_n, Vin_y_n) may be applied to obtain dot product values for the two sub-matrices X and Y.

The op amps may be employed as multiplex amplifiers in order to make the DPE nonvolatile memory array (110) a multiplex mode DPE nonvolatile memory array. One example of the op amps is current amplifiers (310). In one example, for output of each sub-matrix of the DPE nonvolatile memory array (110), the following relationship exists:

$$V_{output} = -R_f \sum V_{input\_i} \times \frac{1}{R_i} V_{output} = -R_f \sum V_{input\_i} \times \frac{1}{R_i} \quad \text{(Eq. 3)}$$

where $R_f$ is the op amp feedback resistance at the output, and $R_i$ is the \multi-level analog resistance of the resistive memory element predefined before calculation of a dot product. Other types of relationships may also exist and be employed.

The multiplex mode DPE nonvolatile memory array (110) may further include a number of current amplifiers (310) to convert the current received from the controls of the first set 331 and second set 332 along the respective column lines (313) into respective output voltages (Vout$_1$, Vout$_2$ . . . Vout$_m$). In one example, the current amplifiers (310) are transimpedance amplifiers ("TIAs"). In one example, a TIA is a current-to-voltage converter, implemented using an operational amplifier as depicted in FIG. 3. The TIA may be employed to amplify the current output of the differential mode DPE nonvolatile memory array (110) to a usable voltage. It is noted that any additional number of circuit layouts may be used to achieve the function of the present systems and methods as described herein.

The currents from the column lines (313) collectively may be collected using a collection line (311), as shown in FIG. 3. The collected currents ( $$\sum_{i=1}^{m}$$

Iout$_i$) in this example represent the sum of two dot products corresponding to the respective matrix values and vector values of the first and second sub-matrices of the array. As noted previously, more than two dot products may be involved in the calculations. Also, as depicted in FIG. 3, a conversion circuit (314) may be placed between the current amplifiers (310) and the collection line (311). In one example, when the voltages output from the current amplifiers (310) are collected, all the voltages are forced to be equal under Kirchhoff's voltage law, and the value for the dot product would be lost. Thus, the currents obtained from the controls (331, 332) are summed. In one example, the current amplifiers (310) may be removed to allow the collection of current as opposed to the voltages output by the current amplifiers (310). In another example and as depicted in FIG. 3, the conversion circuit (314) collects the voltages output from the individual current amplifiers (310), converts the voltages into current, and sums the currents for the different sets of the controls. However, any circuit design may be employed to obtain a sum of the currents from the controls to obtain the dot products and the sum thereof.

As described above, the array described herein may include more than two sets of controls, thus capable of calculating the sum of more than two dot products. For example, the array may include a third set of controls at a third set of the junctions, coupling between a third set of the row lines and a third set of the column lines. In line with those described above for the first and sets of controls, each control of the third set may include a third transistor and a third resistive memory element. Also, each column line may include junctions of the first set, the second set, and the third set in three different row lines. In this case, the sum is further calculated to include a third dot product using currents collected from the controls of third set, corresponding to the respective matrix values and vector values of the third set.

Methods of Calculations

The arrays, or systems including such arrays, described herein may be employed to perform any suitable number of operations to achieve the calculation operations described herein. The operations may be through executing machine-readable instructions. For example, the processor may include suitable hardware architecture to retrieve machine-readable instructions, which may be any executable code, from the data storage device and execute the machine-readable instructions. The machine may be any type of processor, such as a computer. The machine-readable instructions may also cause other components of the systems to execute the instructions. For example, the instructions may cause the different sets of the controls independently to receive a number of programming signals at the respective controls, the programming signals defining a number of matrix values. The instructions may further cause the different sets of the controls independently to receive a number of vector signals at the respective controls, the vector signals defining a number of vector values to be applied to the respective controls. In one example, a sum of a first dot product and a second dot product is calculated using currents collected from respectively the controls of the first set and the second set, corresponding to the respective matrix values and vector values.

Figure 4:
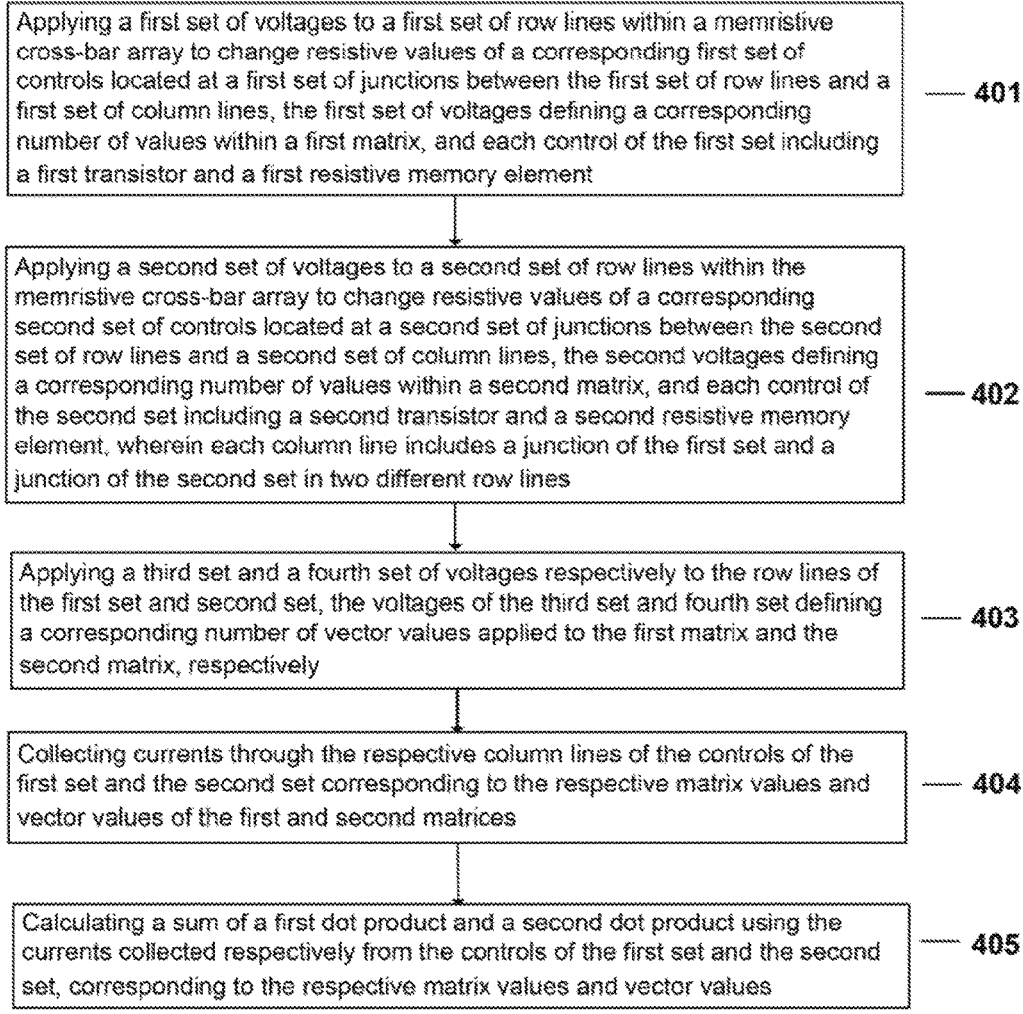
FIG. 4 is a flowchart showing the processes involved in one method performed by the multiplex mode DPE nonvolatile memory array as described herein.

FIG. 4 is a flowchart showing the processes involved in one example of the method of calculation described herein. As shown in FIG. 4, the method may include first applying a first set of voltages to a first set of row lines within a nonvolatile memory cross-bar array to change resistive values of a corresponding first set of controls located at a first set of junctions between the first set of row lines and a first set of column lines, the first set of voltages defining a corresponding number of values within a first matrix, and each control of the first set including a first transistor and a first resistive memory element (401). The method may further include applying a second set of voltages to a second set of row lines within the nonvolatile memory cross-bar array to change resistive values of a corresponding second set of controls located at a second set of junctions between the second set of row lines and a second set of column lines, the second voltages defining a corresponding number of values within a second matrix, and each control of the second set including a second transistor and a second resistive memory element, wherein each column line including a junction of the first set and a junction of the second set in two different row lines (402). These voltages may be program voltages that represent a corresponding number of values within the respective matrices. In one example, a mathematical matrix is mapped to the multiplex DPE nonvolatile memory array for each set of the controls (and thus each dot product), and is ready to be processed as a first and a second sets of values in dot product calculation processes.

The method may further include applying a third set and a fourth set of voltages respectively to the row lines of the first set and second set, the voltages of the third set and fourth set defining a corresponding number of vector values applied to the first matrix and the second matrix, respectively (403). The third and fourth sets of voltages may represent a number of vector values to be applied to the matrix values programmed into the array to obtain a dot product of the matrix values and the vector values for the first and second dot products, respectively. When the voltages of the third and fourth set are applied to the array of the multiplex DPE nonvolatile memory array, the different sets of the controls (and the resistive memory elements therein) see a voltage input (Vin_x_1, Vin_y_1, . . . , Vin_x_n, Vin_y_n) that causes a current to run through resistive memory element. The current level running through is the value of the voltage input (Vin_x_1, Vin_y_1, . . . , Vin_x_n, Vin_y_n) multiplied by the conductance of the resistive memory element, the conductance of the memristor being defined by the aforementioned voltage that changes the resistive value of the resistive memory element. The vector signals act as read signals. The voltage level applied by the vector signals is smaller than the first and second voltages employed to program the resistive memory elements such that the voltage level applied by the vector signals does not change the resistance values of the resistive memory element as programmed by the first and second voltages. Accordingly, in one example the current obtained from the individual resistive memory element through the application of the third and fourth voltages is equal to the multiplication of the matrix value obtained by the program signals at the respective resistive memory elements with the vector values obtained by the vector signals at the respective resistive memory elements for the respective dot products.

The method may further include collecting currents through the respective column lines of the controls of the first set and the second set corresponding to the respective matrix values and vector values of the first and second matrices (404). Finally, the method may include calculating a sum of a first dot product and a second dot product using the currents collected respectively from the controls of the first set and the second set, corresponding to the respective matrix values and vector values (405).

The method may include additional processes. For example, the method may include controlling the controls of the first set and the second set using machine-readable instructions to calculate independently the first dot product and the second dot product (or more in the situation of more than two dot products are calculated). This calculation may be separate from the simultaneous summation of these two dot products. The method may also include outputting the results of the different calculations. Also, the method may include having the processor receive input from and provide output to a number of the remaining hardware units in the system. In one example, the calculation of the sum of the different dot products does not involve storing the matrix values and vector values in a storing memory circuit. As described above, any of the processes involved in the method described herein the method may involve the machine-readable instructions causing the processor, alone or in combination with the other components of the system, to implement the operations, such as those described herein. For example, the method may further include inputting the collected currents to a secondary computer program.

At least as a result of the aforedescribed features, the array described herein may have a number of advantages, including: (1) the summation of two matrix may be done simultaneous during the dot product, which will greatly improve the operation speed; (2) the operation will eliminate the need of storing memory circuit; and (3) the architecture is flexible for single matrix dot product, two matrix dot product summation or sub-matrix summation.

Additional Notes

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

While the present teachings have been described in conjunction with various examples, it is not intended that the present teachings be limited to such examples. The above-described examples may be implemented in any of numerous ways. For example, some examples may be implemented using hardware, software or a combination thereof. When any aspect of an example is implemented at least in part in software, the software code may be executed on any suitable processor or collection of processors, whether provided in a single computer or distributed among multiple computers.

Various examples described herein may be embodied at least in part as a non-transitory machine-readable storage medium (or multiple machine-readable storage media)—e.g., a computer memory, a floppy disc, compact disc, optical disc, magnetic tape, flash memory, circuit configuration in Field Programmable Gate Arrays or another semiconductor device, or another tangible computer storage medium or non-transitory medium) encoded with at least one machine-readable instructions that, when executed on at least one machine (e.g., a computer or another type of processor), cause at least one machine to perform methods that implement the various examples of the technology discussed herein. The computer readable medium or media may be transportable, such that the program or programs stored thereon may be loaded onto at least one computer or other processor to implement the various examples described herein.

The term "machine-readable instruction" are employed herein in a generic sense to refer to any type of machine code or set of machine-executable instructions that may be employed to cause a machine (e.g., a computer or another type of processor) to implement the various examples described herein. The machine-readable instructions may include, but not limited to, a software or a program. The machine may refer to a computer or another type of processor specifically designed to perform the described function(s). Additionally, when executed to perform the methods described herein, the machine-readable instructions need not reside on a single machine, but may be distributed in a modular fashion amongst a number of different machines to implement the various examples described herein.

Machine-executable instructions may be in many forms, such as program modules, executed by at least one machine (e.g., a computer or another type of processor). Generally, program modules include routines, programs, objects, components, data structures, etc. that perform particular tasks or implement particular abstract data types. Typically, the operation of the program modules may be combined or distributed as desired in various examples.

Also, the technology described herein may be embodied as a method, of which at least one example has been provided. The acts performed as part of the method may be ordered in any suitable way. Accordingly, examples may be constructed in which acts are performed in an order different than illustrated, which may include performing some acts simultaneously, even though shown as sequential acts in illustrative examples.

All definitions, as defined and used herein, should be understood to control over dictionary definitions, definitions in documents incorporated by reference, and/or ordinary meanings of the defined terms.

The indefinite articles "a" and "an," as used herein in this disclosure, including the claims, unless clearly indicated to the contrary, should be understood to mean "at least one." Any ranges cited herein are inclusive.

The terms "substantially" and "about" used throughout this disclosure, including the claims, are used to describe and account for small fluctuations, such as due to variations in processing. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in this disclosure, including the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "including" may refer, in one example, to A only (optionally including elements other than B); in another example, to B only (optionally including elements other than A); in yet another example, to both A and B (optionally including other elements); etc.

As used in this disclosure, including the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

In this disclosure, including the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, § 2111.03.

The claims should not be read as limited to the described order or elements unless stated to that effect. It should be understood that various changes in form and detail may be made by one of ordinary skill in the art without departing from the spirit and scope of the appended claims. All examples that come within the spirit and scope of the following claims and equivalents thereto are claimed.

What is claimed:

1. A non-transitory computer readable medium comprising computer executable instructions stored thereon that, when executed by a processor, cause the processor to:
   control a first set of controls and a second set of controls of a nonvolatile memory cross-bar array to:
      receive a number of programming signals, the programming signals defining a number of matrix values; and
      receive a number of vector signals, the vector signals defining a number of vector values to be applied to the first set of controls and the second set of controls; and
   calculate a sum of a first dot product and a second dot product using currents collected respectively from the first set of controls and the second set of controls, the currents corresponding to the matrix values and the vector values,
   wherein the nonvolatile memory cross-bar array includes a number of junctions formed by a number of row lines intersecting a number of column lines, the first set of controls at a first set of the junctions coupling between a first set of the row lines and a first set of the column lines, the second set of controls at a second set of the junctions coupling between a second set of the row lines and a second set of the column lines, each column line including a junction of the first set of controls and a junction of the second set of controls in two different row lines, and each control of the first set of controls and the second set of controls including a transistor and a resistive memory element.

2. The non-transitory computer readable medium of claim 1, wherein the computer executable instructions further cause the processor to control the first set of controls and the second set of controls to independently receive the number of programming signals and independently receive the number of vector signals.

3. The non-transitory computer readable medium of claim 1, wherein the computer executable instructions further cause the processor to control the first set of controls and the second set of controls to independently calculate the first dot product and the second dot product, respectively.

4. The non-transitory computer readable medium of claim 1, wherein the computer executable instructions further cause the processor to control the first set of controls and the second set of controls to simultaneously calculate the first dot product and second dot product, respectively.

5. The non-transitory computer readable medium of claim 1, wherein calculating the sum of the first dot product and the second dot product does not involve storing the matrix values and vector values in a storing memory circuit.

6. The non-transitory computer readable medium of claim 1, wherein the computer executable instructions further cause the processor to:
   control a third set of controls to:
      receive the number of programming signals defining a number of matrix values; and
      receive a number of vector signals, the vector signals defining a number of vector values to be applied to the first set of controls and the second set of controls; and
   calculate a sum of the first dot product, the second dot product and a third dot product using currents collected respectively from the first set of controls, the second set of controls, and the third set of controls, the currents corresponding to the matrix values and the vector values, wherein the third set of controls is at a third set of the junctions, coupling between a third set of the row lines and a third set of the column lines, each control of the third set of controls including a third transistor and a third resistive memory element, and each column line including junctions of the first set of controls, the second set of controls, and the third set of controls in three different row lines.

7. A method, comprising:
controlling a first set of controls and a second set of controls of a nonvolatile memory cross-bar array to:
receive a number of programming signals, the programming signals defining a number of matrix values; and
receive a number of vector signals, the vector signals defining a number of vector values to be applied to the first set of controls and the second set of controls; and
calculating a sum of a first dot product and a second dot product using currents collected respectively from the first set of controls and the second set of controls, the currents corresponding to the matrix values and the vector values,
wherein the nonvolatile memory cross-bar array includes a number of junctions formed by a number of row lines intersecting a number of column lines, the first set of controls at a first set of the junctions coupling between a first set of the row lines and a first set of the column lines, the second set of controls at a second set of the junctions coupling between a second set of the row lines and a second set of the column lines, each column line including a junction of the first set of controls and a junction of the second set of controls in two different row lines, and each control of the first set of controls and the second set of controls including a transistor and a resistive memory element.

8. The method of claim 7, further comprising controlling the first set of controls and the second set of controls to independently receive the number of programming signals and independently receive the number of vector signals.

9. The method of claim 7, further comprising controlling the first set of controls and the second set of controls to independently calculate the first dot product and the second dot product, respectively.

10. The method of claim 7, further comprising controlling the first set of controls and the second set of controls to simultaneously calculate the first dot product and the second dot product, respectively.

11. The method of claim 7, wherein calculating the sum of the first dot product and the second dot product does not involve storing the matrix values and vector values in a storing memory circuit.

12. The method of claim 7, further comprising:
controlling a third set of controls to:
receive the number of programming signals defining a number of matrix values; and
receive a number of vector signals, the vector signals defining a number of vector values to be applied to the first set of controls and the second set of controls; and
calculating a sum of the first dot product, the second dot product and a third dot product using currents collected respectively from the first set of controls, the second set of controls, and the third set of controls, the currents corresponding to the matrix values and the vector values,
wherein the third set of controls is at a third set of the junctions, coupling between a third set of the row lines and a third set of the column lines, each control of the third set of controls including a third transistor and a third resistive memory element, and each column line including junctions of the first set of controls, the second set of controls, and the third set of controls in three different row lines.

* * * * *